United States Patent
Tanaka

(10) Patent No.: US 9,169,994 B2
(45) Date of Patent: Oct. 27, 2015

(54) LIGHT EMITTING DEVICE, AND ILLUMINATION APPARATUS AND LUMINAIRE USING SAME

(71) Applicant: Panasonic Corporation, Osaka (JP)

(72) Inventor: Kenichiro Tanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 51 days.

(21) Appl. No.: 13/792,594

(22) Filed: Mar. 11, 2013

(65) Prior Publication Data

US 2013/0235555 A1 Sep. 12, 2013

(30) Foreign Application Priority Data

Mar. 12, 2012 (JP) .................. 2012-055042

(51) Int. Cl.
| | |
|---|---|
| *F21S 4/00* | (2006.01) |
| *F21V 9/16* | (2006.01) |
| *F21V 3/04* | (2006.01) |
| *F21K 99/00* | (2010.01) |
| *F21Y 101/02* | (2006.01) |

(Continued)

(52) U.S. Cl.
CPC ... *F21V 9/16* (2013.01); *F21K 9/17* (2013.01); *F21V 3/0463* (2013.01); *F21V 3/0481* (2013.01); *F21Y 2101/02* (2013.01); *F21Y 2113/007* (2013.01); *H01L 33/504* (2013.01); *H01L 33/507* (2013.01); *H01L 2224/45144* (2013.01); *H01L 2224/48091* (2013.01)

(58) Field of Classification Search
CPC ................... F21K 9/56; F21V 13/08
USPC ........................... 362/84, 235, 230
See application file for complete search history.

(56) References Cited

U.S. PATENT DOCUMENTS

| 2003/0147242 | A1* | 8/2003 | Stopa ..................... 362/231 |
| 2004/0190304 | A1 | 9/2004 | Sugimoto et al. |
| 2008/0218993 | A1* | 9/2008 | Li ........................... 362/84 |

(Continued)

FOREIGN PATENT DOCUMENTS

| CN | 1465106 A | 12/2003 |
| CN | 101679859 A | 3/2010 |

(Continued)

OTHER PUBLICATIONS

Extended European Search Report for corresponding European Application No. 13001030.9 dated Jul. 30, 2013.

(Continued)

*Primary Examiner* — Evan Dzierzynski
(74) *Attorney, Agent, or Firm* — Renner, Otto, Boisselle & Sklar, LLP

(57) ABSTRACT

A light emitting device including multiple kinds of light emission units with different emission colors; a driver which drives the light emission units; and a cover member which is commonly provided for the multiple kinds of light emission units. The multiple kinds of light emission units include solid state light emitting elements of the same kind, and wavelength converters which cover the solid state light emitting elements, respectively, and convert wavelengths of lights emitted from the solid state light emitting elements into different wavelengths from each other. Further, the cover member contains a correction phosphor for correcting a chromaticity of light obtained by mixing lights emitted from the light emission units, to a predetermined chromaticity.

19 Claims, 10 Drawing Sheets

(51) Int. Cl.
  *F21Y 113/00* (2006.01)
  *H01L 33/50* (2010.01)

(56) References Cited

U.S. PATENT DOCUMENTS

| | | |
|---|---|---|
| 2008/0265269 A1* | 10/2008 | Yoo et al. ................. 257/98 |
| 2009/0103293 A1 | 4/2009 | Harbers et al. |
| 2009/0168406 A1 | 7/2009 | Kawasaki et al. |
| 2010/0172121 A1 | 7/2010 | Hikmet et al. |
| 2010/0207134 A1 | 8/2010 | Tanaka et al. |
| 2011/0044029 A1* | 2/2011 | Konishi et al. ........... 362/97.2 |
| 2011/0051423 A1* | 3/2011 | Hand et al. ............... 362/294 |
| 2011/0084297 A1 | 4/2011 | Ogata et al. |
| 2011/0085352 A1* | 4/2011 | Ito et al. .................... 362/617 |
| 2011/0089455 A1* | 4/2011 | Diana et al. ................. 257/98 |
| 2011/0182068 A1 | 7/2011 | Harbers et al. |
| 2011/0182085 A1* | 7/2011 | Ko et al. .................... 362/612 |
| 2011/0211334 A1 | 9/2011 | Kim |
| 2011/0317397 A1* | 12/2011 | Trottier et al. .............. 362/84 |
| 2012/0038280 A1 | 2/2012 | Zoorob et al. |
| 2012/0051045 A1 | 3/2012 | Harbers et al. |

FOREIGN PATENT DOCUMENTS

| | | |
|---|---|---|
| CN | 102214774 A | 10/2011 |
| JP | H11-39917 | 2/1999 |
| JP | 2003-51209 | 2/2003 |
| JP | 2007-116133 | 5/2007 |
| JP | 2009-49000 | 3/2009 |
| JP | 2009-158417 | 7/2009 |
| JP | 2011-71354 | 4/2011 |

OTHER PUBLICATIONS

Chinese Office Action dated Jul. 9, 2015 issued in corresponding Chinese Patent Application No. 201310077454.4 and English translation thereof.

* cited by examiner

LIGHT EMITTING DEVICE, AND ILLUMINATION APPARATUS AND LUMINAIRE USING SAME

FIELD OF THE INVENTION

The present invention relates to a light emitting device including a plurality of solid state light emitting elements, and an illumination apparatus and a luminaire using same.

BACKGROUND OF THE INVENTION

A light emitting diode (LED) can achieve high luminance emission with low power. Accordingly, it has been used as a light source for various electrical apparatuses such as a display and an illumination apparatus. Recently, in addition to a red LED and a green LED, a blue LED has been put to practical use. Thus, it is possible to emit light having various colors by combining the three colors, i.e., red, green and/or blue of LEDs, or combining an LED with a phosphor which converts a wavelength of light emitted from the LED.

Conventionally, there is known a light emitting device including a light emission unit using an LED as a light source and a light transmitting cover covering the surface of the light emission unit which are provided on a substrate (see, e.g., Japanese Patent Laid-open Publication No. 2011-71354). Further, the light transmitting cover incorporates a phosphor.

In the light emitting device described in Japanese Patent Laid-open Publication No. 2011-71354, the light emission unit using an LED as a light source is substantially integrated with the light transmitting cover containing a phosphor. Generally, the chromaticity of illumination light is determined by the chromaticity of the light emitted from the LED itself and the chromaticity of the light converted by the phosphor. It may need to correct the chromaticity of light emitted from the light emitting device after manufacturing. However, if the light emission unit and the light transmitting cover are formed integrally, a post-correction on the chromaticity of illumination light of the light emitting device becomes more difficult.

SUMMARY OF THE INVENTION

In view of the above, the present invention provides a light emitting device capable of simply correcting the chromaticity of illumination light obtained by mixing lights emitted from multiple types of light emission units with different emission colors using one or more solid state light emitting elements as a light source, and an illumination apparatus and a luminaire using the same.

In accordance with a first aspect of the present invention, there is provided a light emitting device including multiple kinds of light emission units with different emission colors; a driver which drives the light emission units; and a cover member which is commonly provided for the multiple kinds of light emission units, wherein the multiple kinds of light emission units include solid state light emitting elements of the same kind, and wavelength converters which cover the solid state light emitting elements, respectively, and convert wavelengths of lights emitted from the solid state light emitting elements into different wavelengths from each other, and wherein the cover member contains a correction phosphor for correcting a chromaticity of light obtained by mixing lights emitted from the light emission units, to a predetermined chromaticity.

The multiple kinds of light emission units may include a red light emission unit that emits red light, a green light emission unit that emits green light, and a blue light emission unit that emits blue light, and be grouped to obtain a white light by mixing lights emitted from the red light emission unit, the green light emission unit and the blue light emission unit, and the correction phosphor may correct a chromaticity of the white light emitted from each group to a single predetermined chromaticity.

Preferably, the correction phosphor corrects a chromaticity of the white light obtained when the solid state light emitting elements are driven with a rated output by the driver, to a desired chromaticity.

Further, the cover member may include a resin mold having a light transmissivity, and a phosphor sheet which is attached to the resin mold and contains the correction phosphor.

In accordance with a second aspect of the present invention, there is provided an illumination apparatus using the above-described light emitting device.

In accordance with a third aspect of the present invention, there is provided a luminaire including the above light emitting device or the above illumination apparatus.

With the above configuration, the cover member has the correction phosphor which corrects the chromaticity of the light obtained by mixing the lights emitted from the multiple kinds of light emission units, so that it is possible to easily correct the chromaticity of the light obtained by mixing the light emitted from the light emission units through the cover member to obtain the illuminating light with the desired chromaticity.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
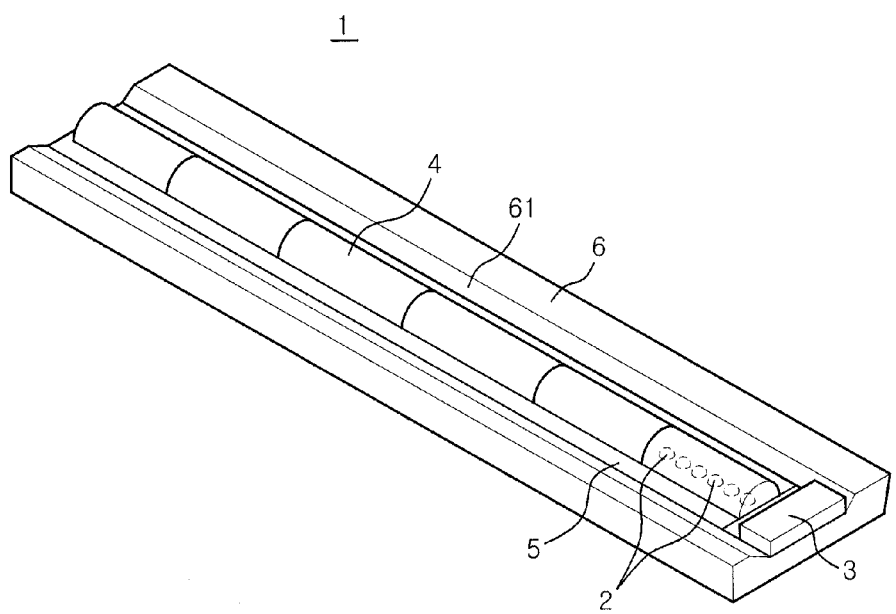
FIG. 1 shows a perspective view of a light emitting device in accordance with an embodiment of the present invention.

Hereinafter, embodiments of the present invention will be described with reference to the accompanying drawings which form a part hereof. Throughout the specification and drawings, like reference numerals will be given to like parts having substantially the same function and configuration, and a redundant description thereof will be omitted.

At first, a light emitting device in accordance with an embodiment of the present invention will be described with reference to FIGS. 1 to 4. As shown in FIG. 1, the light emitting device 1 of this embodiment includes a plurality of light emission units 2, and a driver 3 which drives the light emission units 2. A cover member 4 is commonly provided for the light emission units 2. Further, the light emitting device 1 includes a substrate 5 on which the light emission units 2 are mounted and a frame body 6 which holds the substrate 5.

Figure 2A:
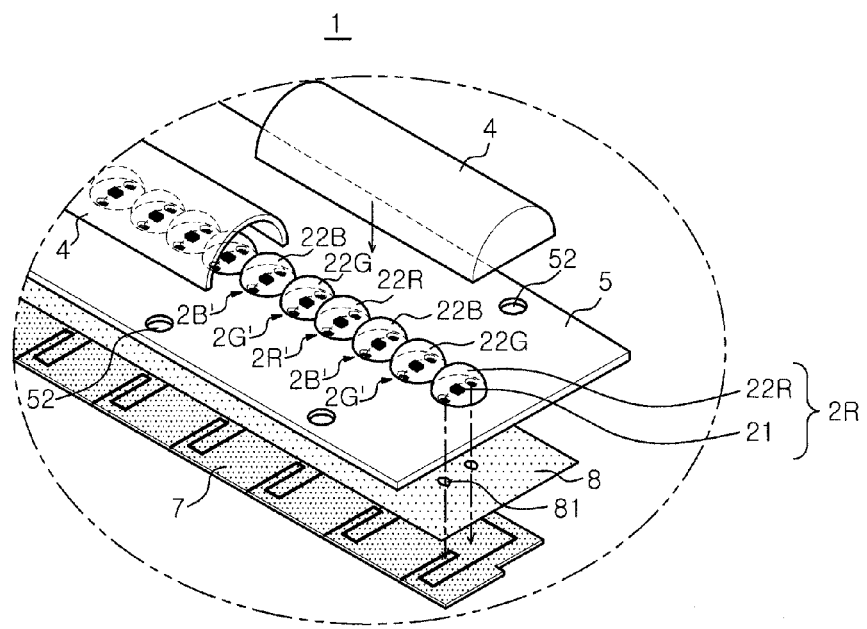
FIG. 2A is an exploded perspective view showing a portion of the light emitting device.

Referring to FIG. 2A, the substrate 5 is a rectangular board, and the light emission units 2 are mounted in a row on the substrate 5 in the longitudinal direction thereof. The cover member 4 is formed in a trough shape and held on the substrate 5 such that the concave side thereof faces the light emission units 2. The frame body 6 has a recess 61 for accommodating the substrate 5. The substrate 5 is fixed to the bottom surface of the frame body 6. Further, the driver 3 is disposed at one end of the frame body 6. The cover member 4 may have another shape such as a dome shape as shown in FIG. 2C without being limited to the trough shape.

Figure 2B:
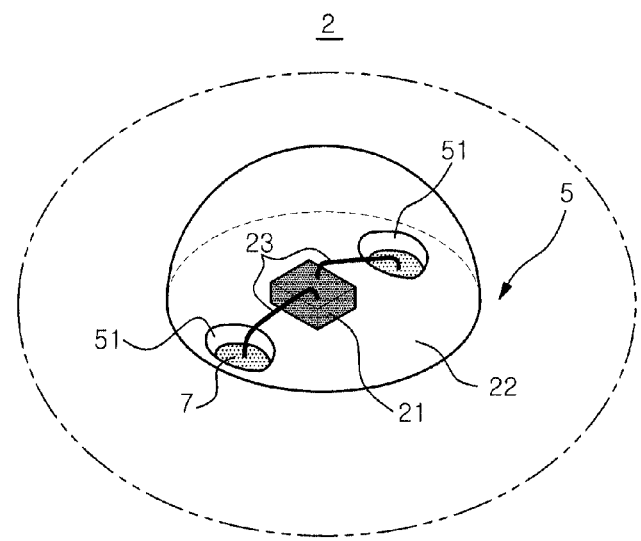
FIG. 2B is an enlarged perspective view of a light emission unit of the light emitting device.
Figure 2C:
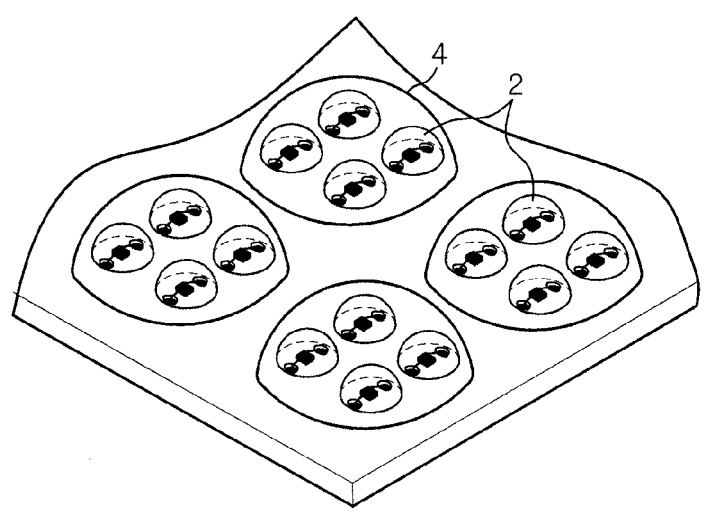
FIG. 2C is a modified example of the light emission unit.
Figure 2D:
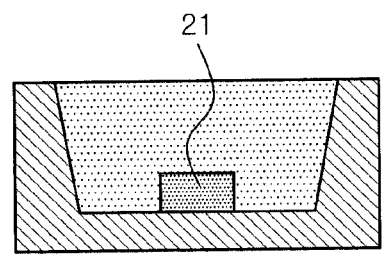
FIG. 2D shows a SMD type package usable in the light emission unit.

As shown in FIGS. 2A and 2B, each of the light emission units 2 includes a solid state light emitting element (hereinafter, referred to as 'LED') 21, and a wavelength converter 22 which convers the LED 21 and converts a wavelength of light emitted from the LED 21. The light emission units 2 include multiple kinds of light emission units with different emission colors. In this example, three kinds of light emission units, a red light emission unit 2R that emits red light, a green light emission unit 2G that emits green light, and a blue light emission unit 2B that emits blue light, are used. In the following description, when a light color is not particularly mentioned, these three kinds of light emission units 2R, 2G and 2B are simply referred to as the light emission units 2. Further, a surface mounted device (SMD) type of package as shown in FIG. 2D may be used as the light emission unit.

The light emission units 2R, 2G and 2B include the same kind of the LEDs 21. Further, the light emission units 2R, 2G and 2B include wavelength converters 22R, 22G and 22B (hereinafter, referred simply to as wavelength converters 22), respectively. The wavelength converter 22 converts the wavelength of the light emitted from the LED 21 into a different wavelength from that of the light emitted from the other light emission units 2. General-purpose compound semiconductors which have the same emission color and preferably emit light in a near-ultraviolet to blue wavelength range are used as the LEDs 21. If the LEDs 21 of the same kind are used as the light emission units 2, it is possible to reduce parts procurement costs. Further, by changing the arrangement or the number of the wavelength converters 22R, 22G and 22B, it is possible to change a color temperature of the illumination light in a wide range.

The wavelength converter 22 is formed by a light transmitting resin material and a phosphor contained in the light transmitting resin material. The phosphor converts a wavelength of light emitted from the LED 21. The phosphor containing light transmitting resin material is coated on an emission surface of the LED 21. Specifically, in the red light emission unit 2R, a red phosphor (e.g., CASN phosphor ($CaAlSiN_3$:Eu, etc.)) that converts the light emitted from the LED 21 into light in a red wavelength range is contained. In the green light emission unit 2G, a green phosphor (e.g., CSO phosphor ($CaSc_2O_4$:Ce, etc.)) that converts the light emitted from the LED 21 into light in a green wavelength range is used.

In the blue light emission unit 2B, if the used LED 21 emits blue light and the chromaticity of the blue light falls within a predetermined chromaticity range, a phosphor is not necessarily required. However, if the LED 21 emits a near-ultraviolet to violet light, a blue phosphor (e.g., BAM:Eu, Mn phosphor, etc.) that converts the light emitted from the LED 21 into light in a blue wavelength range is used in the blue light emission unit 2B. Further, if the LED 21 emits the blue light with the chromaticity not in a predetermined chromaticity range, a blue phosphor is used to adjust the chromaticity of the blue light.

The cover member 4 commonly covers a plurality of the light emission units 2 (e.g., six units of three kinds). The cover member 4 includes a correction phosphor for correcting the chromaticity of the light obtained by mixing the lights emitted from the light emission units 2, to a predetermined chromaticity. The cover member 4 is made of, e.g., acrylic resin having a predetermined durability and light transmissivity, as a main material. The correction phosphor is added to the main material. Further, a diffusing agent may be added to the main material. As the correction phosphor, the same phosphors as or different phosphors from those used in the wavelength converters 22R, 22G and 22B of the light emission units 2 are used singly or in combination thereof. Further, the concentration of the correction phosphor added to the main material may be lowered compared to the wavelength converter 22.

A flat plate formed of a metal plate or aluminum plate is suitably used as the substrate 5. Wire holes 51 are provided in the vicinity of a portion where the LED 21 is mounted. Herein, "flat" is defined as a surface that has irregularities smaller than the thickness of a wiring pattern laid on a general wiring board made of glass epoxy, and the width of the irregularities being substantially equal to or less than 75 μm. The thickness of the substrate 5 is 1 mm, and the substrate 5 preferably has a predetermined rectangular shape.

Alternatively, the substrate 5 may be formed of, e.g., a conductive member such as stainless steel, alumina ceramic, or an insulating material such as aluminum nitride. Further, the substrate 5 may have any size and shape capable of mounting the members such as the LEDs 21 and the wavelength converters 22. Furthermore, the substrate 5 may have any thickness with enough strength not to cause deformation such as bending during handling. The wire holes 51 are provided at both sides of the LED 21 such that the LED 21 is sandwiched between the wire holes 51. The wires 23 are connected to the anode and cathode of the LED 21 and are inserted into the wire holes 51 to pass therethrough.

The light emitting device 1 also includes a lead frame 7 which is disposed on the back side of the substrate 5. The lead frame 7 is electrically connected to the LEDs 21 through the wires 23. The lead frame 7 electrically connects each of the LEDs 21 to the driver 3. Further, the lead frame 7 is patterned such that the LEDs 21 of each color light emission units 2R, 2G and 2B can be individually driven. The lead frame 7 is adhered and fixed to the back surface of the substrate 5 by an adhesive isolation sheet 8.

The lead frame 7 is a wiring member which is formed by pressing and blanking a hoop material of copper. Surface treatment (e.g., Ni plating, Ni/Au plating, or Ni/Pd/Au plating, etc.) to prevent oxidation is performed on the surface of the lead frame 7. The material of the lead frame 7 is also not limited to the copper, and may be, e.g., aluminum or the like. An electrode portion is provided in the lead frame 7, and a power line is joined to the electrode portion by soldering such that the electrode portion is connected to a power supply circuit of the light emitting device 1 via the power line (not shown).

The isolation sheet 8 is an insulating sheet-like adhesive mainly made of thermosetting resin such as epoxy resin. Preferably, a material having high thermal conductivity and having a stress relaxation property is used in the isolation sheet 8. As the isolation sheet 8, for example, "TSA" manufactured by Toray Co., Ltd., "organic green sheet" manufactured by Panasonic Co., Ltd. or the like may be used. Through holes 81 are formed in the isolation sheet 8 such that portions corresponding to the wire holes 51 are opened. The wires 23 pass through the wire holes 51 from an upper surface of the substrate 5 and are connected to the lead frame 7. Portions of the lead frame 7 to which the wires 23 are connected are exposed. Screw holes 52 are formed in the vicinity of both edges of the substrate 5. Screws (not shown) are inserted into the screw holes 52 such that the substrate 5, to which the lead frame 7 is fixed by the isolation sheet 8, is screwed to the frame body 6.

The LED 21 is suitably used in a so-called face-up type in which the anode and cathode electrode of the LED 21 are provided on the upper surface thereof. The LED 21 is mounted as follows. The LED 21 is bonded onto the substrate 5 by using, e.g., a silicon-based die bonding material (not shown). The wires 23 electrically connect the LED 21 to the lead frame 7. More specifically, the wires 23 are bonded and joined to the lead frame 7 through the wire holes 51 provided in the substrate 5 from the electrodes on the top of the LED 21. Accordingly, the LED 21 is electrically connected to the lead frame 7. Further, the die bonding material is not limited to the above and may be, e.g., silver paste, or other epoxy resin materials with high heat resistance.

The wavelength converter 22 is made of, e.g., silicone resin having a high light transmissivity as a main material. The wavelength converter 22 has a hemispherical outer periphery and has an inner size capable of covering the LED 21. The same resin as that used in the wavelength converter 22 is filled in the wire holes 51 through which the wires 23 pass to electrically connect the LED 21 with the lead frame 7. Then, the wavelength converter 22 is mounted. The outer diameter of the wavelength converter 22 is a refractive index of the light transmitting resin material of the wavelength converter 22 times the circumscribed circle diameter of the LED 21. For example, if the light transmitting resin material is silicone resin, the outer diameter of the wavelength converter 22 is 1.41 or more times the circumscribed circle diameter of the LED 21.

The wavelength converter 22 is mounted on the substrate 5 by covering the LED 21 with a concave shaped bowl sizeable enough to contain the LED 21 and the wires 23, filling the bowl with silicone resin, and then removing the bowl. The light transmitting resin material of the wavelength converter 22 is not limited to the above, and may be, e.g., an inorganic material such as epoxy resin or glass. Further, the resin filled in the wire holes 51 may be a material different from the resin used in the wavelength converter 22.

Figure 3A:
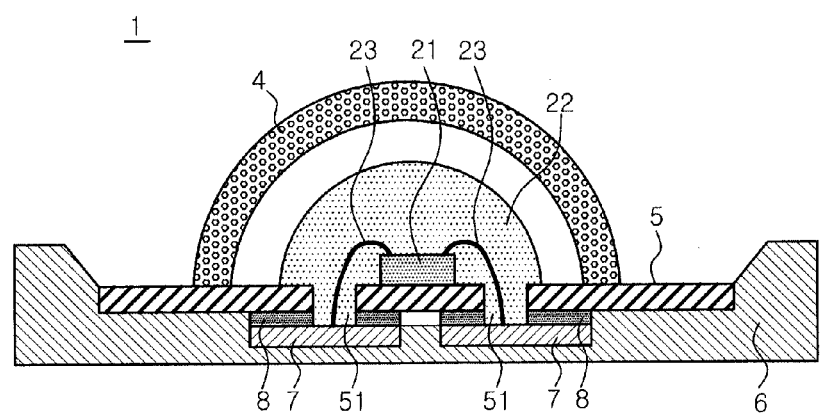
FIG. 3A illustrates a cross-sectional view perpendicular to the longitudinal direction of the light emitting device in accordance with the embodiment.
Figure 3B:
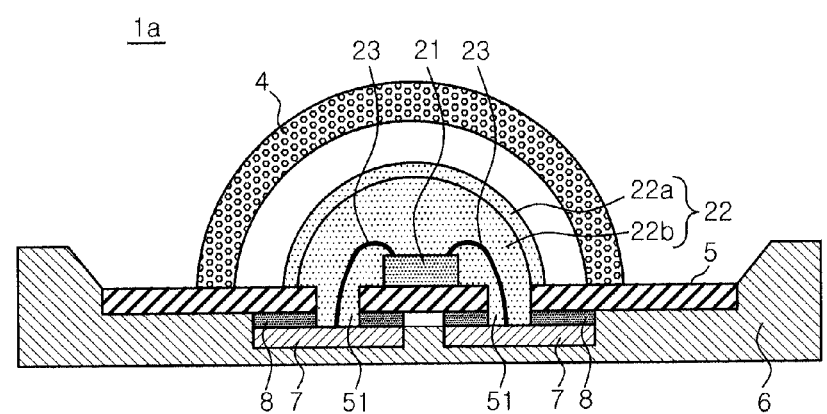
FIG. 3B represents a cross-sectional view of a light emitting device including a modified wavelength converter.

Alternatively, as shown in FIG. 3B, the wavelength converter 22 may be formed by filling the silicone resin or resin 22b having the same refractive index as the silicone resin in a concave portion of a bowl-shaped member 22a, and mounting it on the substrate 5 to cover the LED 21. The bowl-shaped member 22a is made of silicone resin and has a size containing the LED 21 and the wires 23. Then, the resin filled in the concave portion is cured, and the bowl-shaped member and the filled resin have an integral structure without optical refractive interface between them. Thus, loss of light due to total reflection in the wavelength converter 22 does not occur. With this configuration, it is possible to facilitate the manufacture of the wavelength converter and it is possible to more easily adjust the chromaticity.

For the wires 23, for example, general-purpose gold wires are used. Also, aluminum wires, silver wires, copper wires, or the like may be used. The wires 23 are bonded to the electrode portion (not shown) provided in the lead frame 7 and the electrodes of the LED 21 by a bonding method known in the art such as thermal bonding or ultrasonic bonding.

According to the above configuration, the mounting surface of the LED 21 and the lead frame 7 serving as electrical wiring are provided separately with the substrate 5 therebetween. The LED 21 and the lead frame 7 are electrically connected by the wires 23 through the wire holes 51, thus simplifying the wiring configuration. Further, since the structure of the lead frame 7 is simple, the manufacturing costs may be lowered. Furthermore, since the lead frame 7 is disposed on the back side of the substrate 5, and a portion where the LED 21 and the wavelength converter 22 are mounted, i.e., the mounting surface is a flat surface, the fixation of the wavelength converter 22 can be improved. As a result, it is possible to reduce the void generation. Furthermore, since the mounting of the LED 21 and the wavelength converter 22 is facilitated, the manufacturing efficiency is also improved.

Figure 4:
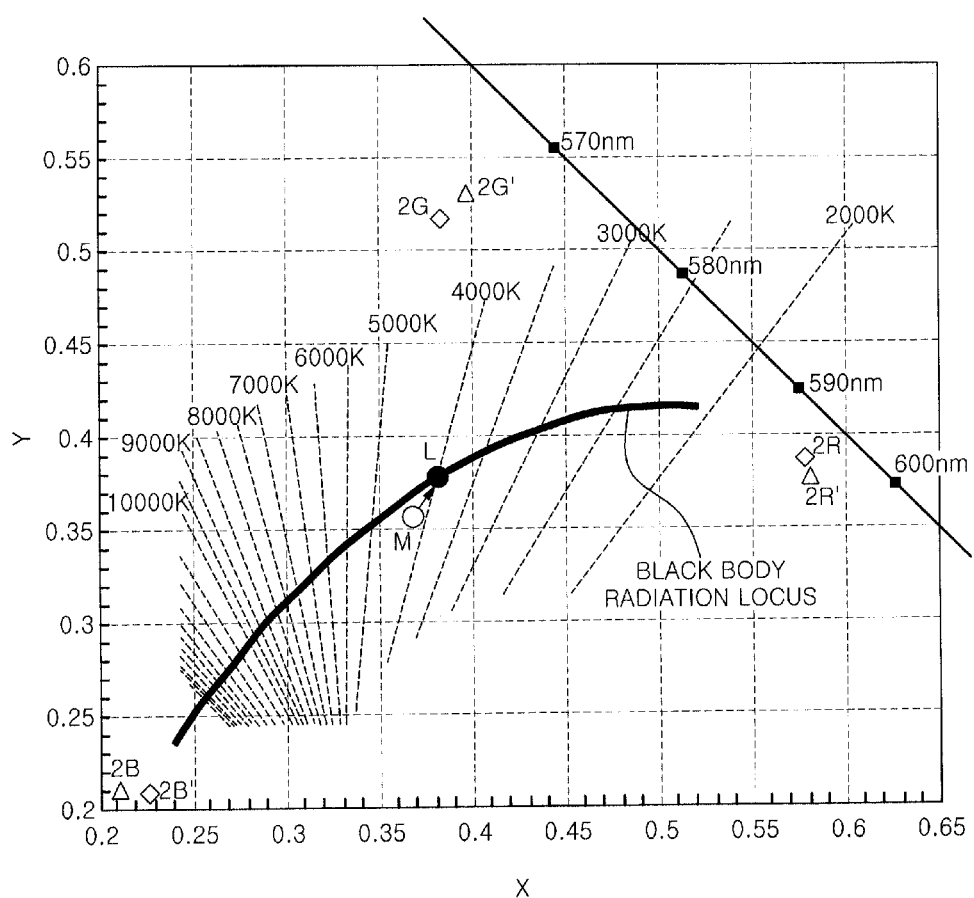
FIG. 4 is a chromaticity diagram for explaining a correction of the chromaticity of illumination light using the cover member in the light emitting device.

In the embodiment, the red light emission unit 2R, the green light emission unit 2G, and the blue light emission unit 2B are grouped so as to obtain white light by mixing lights emitted therefrom. For example, as shown in FIG. 2, one group includes six light emission units 2 of red light emission units 2R and 2R', green light emission units 2G and 2G', and blue light emission units 2B and 2B'. FIG. 4 shows the chromaticity of each of the light emission units 2 when each of the light emission units 2 (2R~2B') is driven with the rated output (e.g., 3 V, 20 mA) of the LED 21 by the driver 3, and the chromaticity (point M in FIG. 4) of the white light obtained by mixing these lights.

Further, the chromaticity required for the illumination light of the light emitting device 1 is, e.g., intersection coordinates (set chromaticity L) of the black body radiation locus and the isochromatic temperature line having a color temperature of 4000K. If the LED 21 is driven with the rated output, the radiation intensity (radiant flux) of the light emitted from the LED is stabilized. Therefore, when the light emitting device 1 is used, it is possible to reproduce the illumination light of the chromaticity that is set at the time of manufacture.

The chromaticity M of the white light obtained by the light emission units 2 is the chromaticity (x, y), each component of which is smaller than the set chromaticity L as illustrated. In this case, for example, the cover member 4 containing a yellow phosphor (e.g., YAG-based phosphor) as a correction phosphor is provided to cover each of the light emission units 2. Thus, light transmitted through the cover member 4 is shifted in the direction in which each component of the chromaticity (x, y) increases from the original chromaticity. As a result, the light emitting device 1 can irradiate a natural white light having a chromaticity on the black body radiation locus.

In the configuration described above, the wavelength converter 22 covers the emission surface of the LED 21. Accordingly, the wavelength converter 22 is substantially integrated with the LED 21 to form the light emission unit 2. However, the cover member 4 is not integrated with the light emission units 2. Therefore, after measuring the chromaticity of each color light emission units 2R, 2G and 2B, and the chromaticity of the mixed light obtained therefrom, the cover member 4 containing a suitable correction phosphor can be accordingly used. As a result, a post-correction on the chromaticity of the illumination light of the light emitting device can be simply performed.

Further, in the present embodiment, the light emission units 2 are grouped and the cover member 4 containing a correction phosphor suitable for the corresponding group can be used. Thus, the chromaticity of the white light emitted from each group is corrected to a single predetermined chromaticity, e.g., the set chromaticity L described above. As a result, the illumination light of the light emitting device 1 can be corrected to a desired chromaticity without non-uniformity in color.

Figure 5:
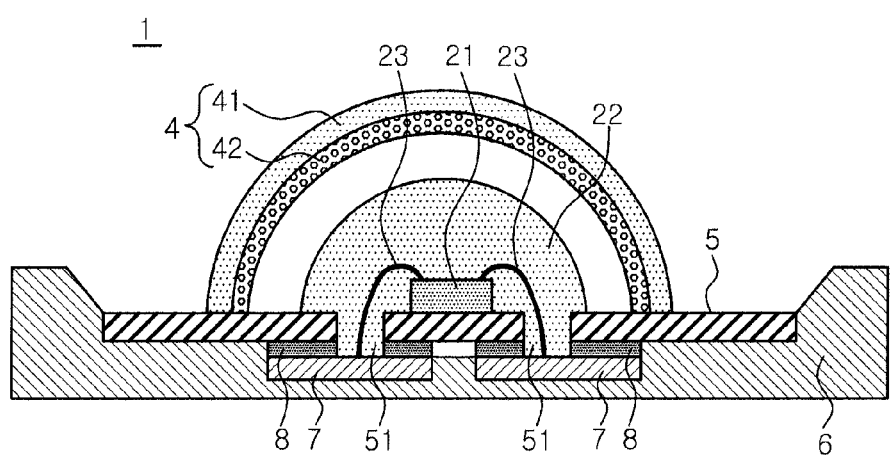
FIG. 5 is a cross-sectional view of a light emitting device in accordance with a modification example of the above embodiment.

Next, a light emitting device in accordance with a modification example of the above embodiment will be described with reference to FIG. 5. In the light emitting device 1 of this modification example, the cover member 4 includes a resin mold 41 having a light transmissivity, and a phosphor sheet 42 which is attached to the resin mold 41. The phosphor sheet 42 contains a correction phosphor similar to that of the above-described embodiment. The phosphor sheet 42 is attached to the inner peripheral surface of the resin mold 41 formed in a trough shape.

According to the embodiment described above, when the cover member 4 is manufactured, a light transmitting resin containing a correction phosphor needs to be formed in the trough shape described above. However, according to the modification example, the resin mold 41 does not contain a correction phosphor, and the phosphor sheet 42 may be attached to the resin mold 41. Accordingly, the manufacture of the cover member 4 is simplified.

The light emitting device 1 in accordance with the present invention can be used in an illumination apparatus. In the illumination apparatus, the light emitting device 1 is attached to a predetermined fixture, and accommodated in a housing, a glove, or the like. Further, two or more light emitting devices may be incorporated into the illumination apparatus. Hereinafter, examples of the illumination apparatus and luminaires using the light emitting device in accordance with the present invention will be described with reference to FIGS. 6A to 7B.

Figure 6A:
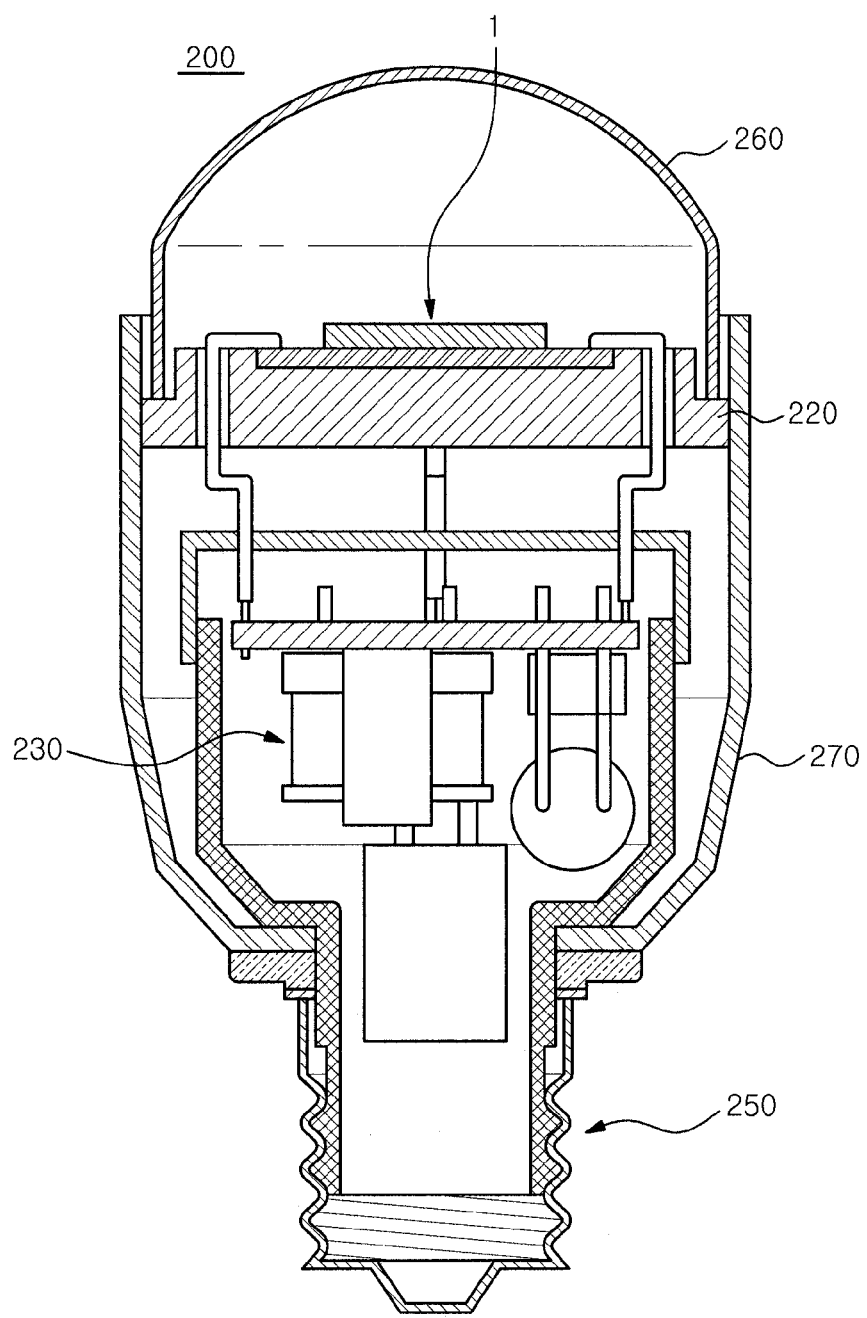
FIG. 6A shows an example of the illumination apparatus in which the light emitting device in accordance with the present invention is used.

FIG. 6A illustrates an LED bulb 200 as an example of an illumination apparatus. As shown in FIG. 6A, the light emitting device 1 is mounted on a holder 220. The holder 220 is made of a high thermal conductive material, e.g., aluminium, so that heat from the light emitting device 1 can be dissipated to a housing 270 with high efficiency. The driver 3 is built into a power supply unit 230. A glove 260 covers the light emitting device 1. Further, the glove 260 is formed in a substantially dome shape to cover the light emitting device 1, and an open end thereof is fixed to the housing 270 and the holder 220 by an adhesive.

The housing 270 is formed in, e.g., a cylindrical shape. The light emitting device 1 is disposed at one end portion of the housing 270, and a screw cap 250 is disposed on the other end portion of the housing 270. In order to function as a heat dissipating member (heat sink) to dissipate heat from the light-emitting device 10, the housing 270 is also formed of a material with good thermal conductivity, e.g., aluminum.

With the illumination apparatus shown in FIG. 6A, it is possible to achieve compatibility with an incandescent lamp since the LED bulb 200 is easily installed into a socket made for the incandescent lamp with the screw cap 250, in addition to the effects of the present invention.

Figure 6B:
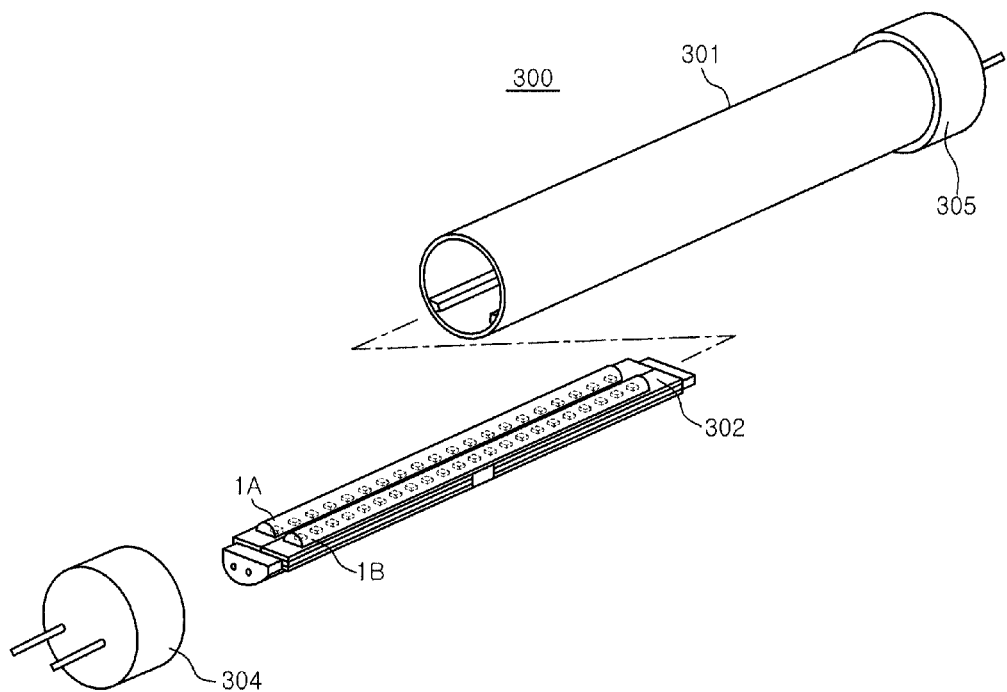
FIG. 6B depicts an example of the illumination apparatus in which multiple light emitting devices in accordance with the present invention are used.

FIG. 6B illustrates an illumination apparatus 300 in which multiple light emitting devices according to the present invention is used. As shown in FIG. 6B, the illumination apparatus 300 includes two light emitting devices 1A and 1B. The illumination apparatus 300 includes an elongated tubular housing 301, a base 302 disposed in the housing 301, and a pair of caps 304 and 305 attached to both ends of the housing 301. The light emitting devices 1A and 1B are mounted on the base 302.

The housing 301 has an elongated tubular shape having openings at both ends, and accommodates the base 302 and the light emitting devices 1A and 1B. The material of the housing 301 is not particularly limited, but it is preferably a light transmitting material. As the light transmitting material, for example, resin such as plastic, glass, or the like may be used. Further, the cross-sectional shape of the housing 301 is not particularly limited, and may be a circular ring shape or polygonal ring shape. The base 302 preferably functions as a heat sink for dissipating the heat from the light emitting devices 1A and 1B. To this end, the base 302 is preferably formed of a material with high thermal conductivity such as metal.

Since the illumination apparatus 300 shown in FIG. 6B is easily installed into a socket made for a straight tubular florescent lamp with the caps 304 and 305, it is possible to ensure compatibility with the straight tubular florescent lamp, in addition to the effects of the present invention.

Figure 7A:
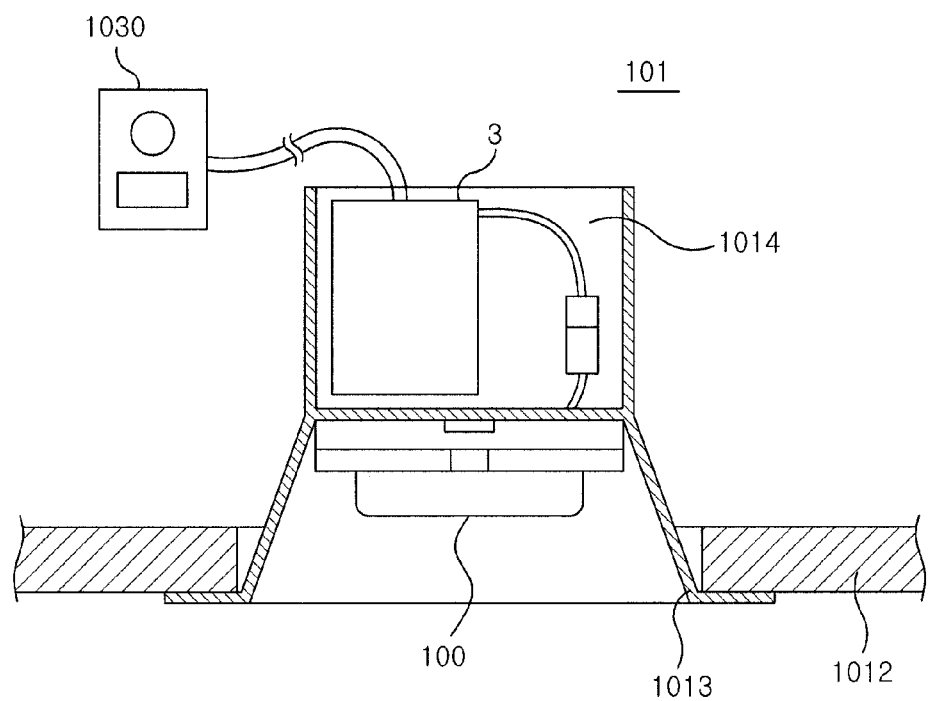
FIG. 7A illustrates an example of a luminaire in which the light emitting device in accordance with the present invention is used.

Next, FIG. 7A illustrates a luminaire 101 to which the illumination apparatus 100 having the light emitting device 1 in accordance with the present invention is applicable. As illustrated, the luminaire 101 is, e.g., a down light mounted to be embedded in a ceiling 1012. The illumination apparatus 100 is detachably installed in a receiving portion of a frame 1013. The driver 3 is provided in a power supply unit 1014, and controls the illumination apparatus 100 in response to the manipulation of an operation unit 1030 by a user.

In the luminaire 101 shown in FIG. 7A, the thin type illumination apparatus 100 can be detachably installed. Therefore, it is possible to enhance usage convenience in addition to the effects of the present invention.

Figure 7B:
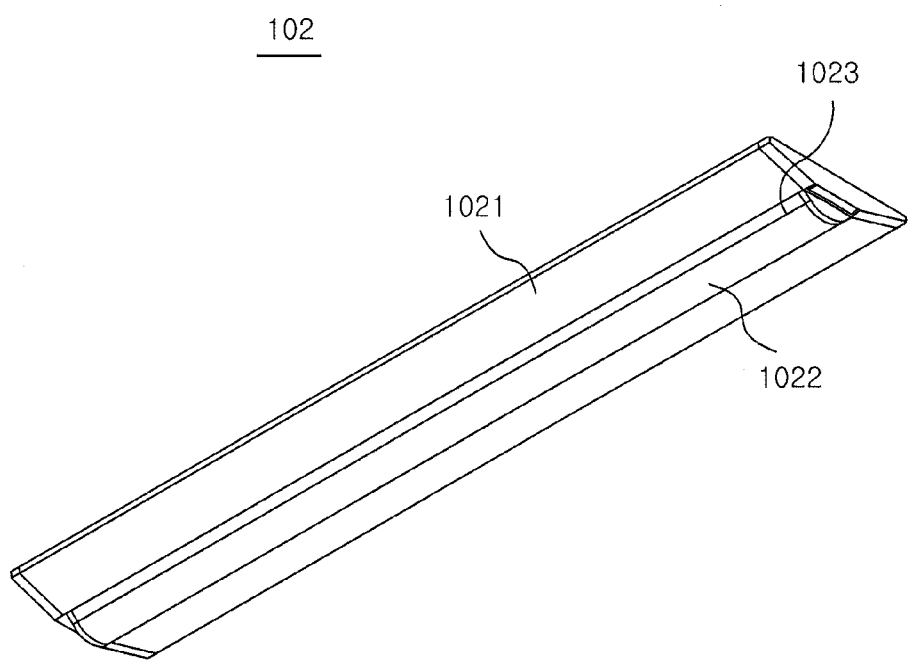
FIG. 7B represents another example of the luminaire with which the illumination apparatus using the light emitting device in accordance with the present invention is equipped.

FIG. 7B illustrates a ceiling direct mounting type luminaire 102 in which the light emitting device 1 according to the present invention can be applied. The luminaire 102 includes a main body 1021 which is directly attached to a ceiling member (not shown). The light emitting device 1 (not shown) is attached to the main body 1021 via a plate-shaped attachment member 1023. Further, the light emitting device 1 is covered by a light transmitting cover 1022 made of resin such as plastic or glass.

The luminaire 102 shown in FIG. 7B can replace a luminaire using a straight tubular florescent lamp while providing increased efficiency in addition to the effects of the present invention.

Although the illumination apparatus and the luminaire using the light emitting device according to the present invention have been illustrated and described, they are merely exemplary, and the light emitting device according to the present invention may be used in various illumination apparatuses and luminaires.

The present invention is not limited to the above embodiments, and various modifications can be made. Although a configuration using three kinds of blue, green and red light emission units has been illustrated in the above embodiment, for example, a white light emission unit using a so-called white LED obtained by coating a yellow phosphor on a blue LED may be added. As the white LED, for example, an LED unit in accordance with the LED chromaticity provisions (ANSI standard) prescribed in the United States is configured such that a variation in chromaticity falls within a predetermined range in the black body locus.

Thus, if the light emitting device 1 is applied to chromaticity-variable illumination, the LED unit according to the provisions is obtained from the market and used for the chromaticity frequently used. Thus, the manufacturing efficiency of the light emitting device 1 is improved, and it is possible to reduce a load on the LEDs 21 of the other light emission units 2.

Further, although the cover member is provided to commonly cover three kinds of six light emission units in the above embodiment, it is not limited thereto, and various modifications can be made. For example, the cover member may be provided to commonly cover two kinds of four light emission units, or three kinds of three light emission units.

While the invention has been shown and described with respect to the embodiments, it will be understood by those skilled in the art that various changes and modification may be made without departing from the scope of the invention as defined in the following claims.

What is claimed is:

1. A light emitting device comprising:
    a plurality of light emission groups, each of the light emission groups including multiple kinds of light emission units with different emission colors;
    a driver which drives the light emission units in said each of the light emission groups; and
    a plurality of cover members detachable from each other, each of the cover members corresponding to one of the light emission groups,
    wherein each of the cover members is commonly provided for the multiple kinds of light emission units in said one of the light emission groups,
    wherein the multiple kinds of light emission units in said each of the light emission groups include solid state light emitting elements of the same kind, and wavelength converters which cover the solid state light emitting elements, respectively, and convert wavelengths of lights emitted from the solid state light emitting elements into different wavelengths from each other,
    wherein said each of the cover members contains a correction phosphor for correcting a chromaticity of light obtained by mixing lights emitted from the light emission units in said one of the light emission groups, to a predetermined chromaticity
    wherein each of the wavelength converters includes:
        a bowl-shaped member formed of silicone resin; and
        a solid material filling a concave portion of the bowl-shaped member, and
    wherein the bowl-shaped member and the solid material are in close contact with each other, and
    wherein the solid material has a refractive index which is identical to a refractive index of the bowl-shaped member.

2. The light emitting device of claim 1, wherein the multiple kinds of light emission units in said each of the light emission groups include a red light emission unit configured to emit red light, a green light emission unit configured to emit green light, and a blue light emission unit that emits configured to emit blue light, and are grouped to obtain a white light by mixing lights emitted from the red light emission unit, the green light emission unit and the blue light emission unit, and
    wherein the correction phosphor of said each of the cover members is configured to correct a chromaticity of the white light emitted from said one of the light emission groups to a single predetermined chromaticity.

3. The light emitting device of claim 2, wherein the correction phosphor of said each of the cover members corrects a chromaticity of the white light obtained when the solid state light emitting elements in said one of the light emission groups are driven with a rated output by the driver, to a desired chromaticity.

4. The light emitting device of claim 3, wherein said each of the cover members further includes a resin mold having a light transmissivity, and a phosphor sheet which is attached to the resin mold and contains the correction phosphor.

5. An illumination apparatus using the light emitting device described in claim 4.

6. A luminaire including the light emitting device described in claim 4.

7. An illumination apparatus using the light emitting device described in claim 3.

8. A luminaire including the light emitting device described in claim 3.

9. The light emitting device of claim 2, wherein said each of the cover members further includes a resin mold having a light transmissivity, and a phosphor sheet which is attached to the resin mold and contains the correction phosphor.

10. An illumination apparatus using the light emitting device described in claim 9.

11. A luminaire including the light emitting device described in claim 9.

12. An illumination apparatus using the light emitting device described in claim 2.

13. A luminaire including the light emitting device described in claim 2.

14. The light emitting device of claim 1, wherein said each of the cover members further includes a resin mold having a light transmissivity, and a phosphor sheet which is attached to the resin mold and contains the correction phosphor.

15. An illumination apparatus using the light emitting device described in claim 14.

16. A luminaire including the light emitting device described in claim 14.

17. An illumination apparatus using the light emitting device described in claim 1.

18. A luminaire including the light emitting device described in claim 1.

19. The light emitting device of claim 1, wherein the solid material is formed by filling and curing a resin in the concave portion of the bowl-shaped member.

* * * * *